United States Patent
Talwar et al.

(10) Patent No.: US 6,380,044 B1
(45) Date of Patent: Apr. 30, 2002

(54) HIGH-SPEED SEMICONDUCTOR TRANSISTOR AND SELECTIVE ABSORPTION PROCESS FORMING SAME

(75) Inventors: Somit Talwar, Palo Alto; Yun Wang, San Jose, both of CA (US); Michael O. Thompson, Ithaca, NY (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

(21) Appl. No.: 09/548,326

(22) Filed: Apr. 12, 2000

(51) Int. Cl.⁷ ............................................. H01L 21/336
(52) U.S. Cl. ....................... 438/308; 438/795
(58) Field of Search ........................ 438/14, 197, 199, 438/301, 305, 306, 307, 308, 486, 487, 508, 509, 530, 535, 795, 798

(56) References Cited

U.S. PATENT DOCUMENTS

| | | | |
|---|---|---|---|
| 4,151,008 A | 4/1979 | Kirkpatrick | 148/1.5 |
| 4,456,490 A | 6/1984 | Dutta et al. | 148/1.5 |
| 4,617,066 A | 10/1986 | Vasudev | 148/1.5 |
| 5,756,369 A | 5/1998 | Aronowitz et al. | 438/16 |
| 5,897,381 A * | 4/1999 | Aronowitz et al. | 438/798 |
| 5,908,307 A * | 6/1999 | Talwar et al. | 438/199 |
| 5,923,963 A * | 7/1999 | Yamanaka | 438/157 |
| 5,989,966 A * | 11/1999 | Huang | 438/305 |
| 6,153,483 A * | 11/2000 | Yeh et al. | 438/299 |
| 6,188,106 B1 * | 2/2001 | Gardner et al. | 257/339 |

OTHER PUBLICATIONS

S. Prussin, et al., Role of Ion Mass, Implant Dose, and Wafer Temperature on End–of–Range Defects, J. Electrochem. Soc., vol. 137, No. 6, pp 1912–1914, The Electrochemical Society, Inc., Jun. 1990.

(List continued on next page.)

*Primary Examiner*—David Nelms
*Assistant Examiner*—David Nhu
(74) *Attorney, Agent, or Firm*—Allston L. Jones

(57) ABSTRACT

A high-speed semiconductor transistor and process for forming same. The process includes forming, in a Si substrate (10), spaced apart shallow trench isolations (STIs) (20), and a gate (36) atop the substrate between the STIs. Then, regions (40,44) of the substrate on either side of the gate are either amorphized and doped, or just doped. In certain embodiments of the invention, extension regions (60,62 or 60',62') and deep drain and deep source regions (80, 84 or 80',84') are formed. In other embodiments, just deep drain and deep source regions (80, 84 or 80', 84') are formed. A conformal layer (106) is then formed atop the substrate, covering the substrate surface (11) and the gate. The conformal layer can serve to absorb light and/or to distribute heat to the underlying structures. Then, at least one of front-side irradiation (110) and back-side irradiation (116) is performed to activate the drain and source regions and, if present, the extensions. Explosive recrystallization (124) is one mechanism used to achieve dopant activation. A deep dopant region (120) may be formed deep in the substrate to absorb light and release energy in the form of heat (122), which then activates the doped regions.

80 Claims, 8 Drawing Sheets

OTHER PUBLICATIONS

E. D'Anna, et al., Multilayer Titanium Nitride and Silicide Structures Synthesized by Multipulse Excimer Laser Irradiation, elsevier Science Publishers B. V., pp 353–357, Appliced Surface Science 54, 1992.

V. Bohac, et al., Tungsten Silicide Formation by XeCl Excimer–Laser Irradiation of S/Si Samples, Applied Physics A. Solids and Surfaces, pp. 391–396, Applied Physics A 56, 1993.

E. d'Anna, et al., Laser Synthesis of Metal Silicides, Applied PhysicsA, Solids and Surfaces, pp. 325–335, Applied Physics A 45, 1988.

Richard B. Fair, Damage Removal/Dopant Diffusion Tradeoffs in Ultra–Shallow Implanted $p^+$–n Junctions, IEEE Transactions on Electron Devices, vol. 37, No. 10, pp. 2237–2242, Oct. 1990.

Toshimitsu Akane, et al., Two–Step Doping Using Excimer Laser in Boron Doping of Silicon, Jpn. J. Appl. Phys., vol. 31, part 1, No. 12B, pp. 4437–4440, Dec. 1992.

P. G. Carey, et al., A Shallow Junction Submicrometer PMOS Process Without High–Temperature Anneals, IEEE Electron Device Letter, vol. 9 No. 10,pp. 542–544. Oct. 1988.

S. Acco, et al., Avoiding End–of range Dislocations in Ion–implanted Silicon, Elsevier Science S. A., Materials Science and Engineering B34, pp. 168–174, 1995.

Somit Talwar, et al., Ultra–Shallow, Abrupt, and Highly–Activated Junctions by Low–Energy Ion Implantation and Laser Annealing, Proceedings of the $13^{th}$ International Conference on Ion Implantation Technology, IEEE, pp 1171–1174, 1999.

* cited by examiner

HIGH-SPEED SEMICONDUCTOR TRANSISTOR AND SELECTIVE ABSORPTION PROCESS FORMING SAME

BACKGROUND OF THE INVENTION

1. Field of the Invention

The present invention relates to semiconductor processing, and more particularly relates to high-speed semiconductor transistors and a process for forming same.

2. Description of the Related Art

Improvements in semiconductor technology and semiconductor manufacturing are the main drivers to the reduction of cost and the increase in speed of computers. There have been many improvements to semiconductor devices to increase their speed and performance, ranging from packaging of integrated circuits ("chips") to the wiring of the devices on the chip, to the design of the devices themselves.

Improvements in chip performance are generally obtained by changing the physical structure of the devices comprising the chip by inventing a new process (or improving an existing process) for making the devices. For example, with the continuing need for smaller integration densities and faster operational speeds, dopant impurity profiles for integrated devices are becoming increasingly shallower with greater dopant concentrations, as compared to previous generations of integrated devices. The shallower dopant profiles and greater dopant concentrations are used to decrease the sheet resistance of-the source and drain regions to obtain faster transient response or logic-state switching rates relative to previous chips.

Thermal annealing techniques, such as rapid thermal annealing (RTA) or rapid thermal process (RTP), are becoming less attractive as options for performing activation annealing of doped regions of an integrated device after dopant implantation. This is mainly because thermal annealing techniques typically require heating the entire substrate to a maximum temperature for a time sufficient to activate the integrated device's source and drain regions, after which the substrate is permitted to cool to quench the doped source and drain regions. This approach is problematic because the substrate is capable of holding a relatively large amount of thermal energy, which requires significant time to be dissipated via radiation and convection before the dopant ions become incapable of moving due to solidification of the doped regions. Therefore, during the time required for the substrate to cool, the dopant ions can readily move beyond the intended boundaries of the doped regions (a phenomenon which is sometimes referred to as "transient enhanced diffusion"). As a result, the junction depth of the source/drain regions becomes greater than desired. This, in turn, leads to increased off-state leakage currents and thus reduced device performance.

The speed of semiconductor devices has also been limited to date by physical constraints on the amount of activated dopant concentrations. More specifically, for any two species of dopant and substrate ions, under equilibrium conditions, there are only a certain number of dopant ions that can be positioned at activated sites within the crystalline lattice of substrate ions. This limit is known as the 'solid solubility limit'. It is generally not possible in the fabrication of semiconductor devices to attain activated dopant concentrations above the solid solubility limit. With thermal annealing techniques, the minimum sheet resistance attainable in the doped regions is controlled by the solid solubility limit, which is $3 \times 10^{20}$ ions/cm$^3$ for boron, $2 \times 10^{21}$ ions/cm$^3$ for arsenic, and $1.5 \times 10^{21}$ ions/cm$^3$ for phosphorous. Lower sheet resistance in the doped regions of an integrated device generally leads to faster transient response or logic-state switching rates. Accordingly, it would be desirable to increase the dopant concentration in active sites within an integrated device's doped region(s) to levels above the solid solubility limit. Such dopant concentrations are not presently attainable with known conventional annealing techniques.

The nature of the dopant profiles and the carrier concentration affect the performance of the chip. A gradual dopant profile is prone to higher spreading resistance, while a reduced carrier (dopant) concentration can result in a higher sheet resistance than is desired. The formation of abrupt junctions (e.g., sharp dopant profiles) reduces overlap capacitance and spreading resistance, and the ability to increase the dopant concentration lowers the sheet resistance. Both these effects serve to increase the speed and improve the performance of the chip.

There are many prior art semiconductor processes pertaining to improving the performance of a semiconductor device by changing the properties of the device. For example, U.S. Pat. No. 5,756,369 (the '369 patent), entitled "Rapid thermal processing using narrowband infrared source and feedback", describes rapid thermal processing (RTP) of a semiconductor wafer performed by scanning a laser beam across a silicon dioxide film in contact with a surface of the wafer. The silicon dioxide film absorbs the energy from the laser beam and converts the energy to heat. The heat, in turn, is transferred to the wafer. Temperature feedback can be obtained to increase control and uniformity of temperatures across the wafer. However, a shortcoming of this technique is that the temperature of the entire wafer rises to the dopant activation temperature (typically from 800° C. to 1100° C.). Also, a silicon film is required to be deposited on the backside of the wafer. In addition, a continuous wave $CO_2$ laser is used, which does not allow for sufficient cooling of the wafer region being processed for many applications.

U.S. Pat. No. 5,897,381, (the '381 patent) entitled "Process of forming a layer and semiconductor substrate", discloses and claims a process of forming a layer on a semiconductor substrate having a front side and a backside, the process comprising the steps of placing a film of material in contact with the backside of the substrate, then directing a beam of narrowband energy onto the film such that the film absorbs the energy and transfers heat to the substrate, then controlling temperatures across the backside of the substrate, and then finally performing an additive process on the front side of the substrate. However, like the '369 patent, the '381 patent has the shortcoming that the entire wafer rises to the dopant activation temperature (typically from 800 to 1100° C.) when heated. Also, a silicon dioxide film needs to be deposited at the back of the wafer, and a continuous wave $CO_2$ laser is used, which does not allow for sufficient cooling of the wafer region being processed for many applications.

U.S. Pat. No. 5,908,307, entitled "Fabrication process for reduced-dimension FET devices", describes pre-amorphization of a surface layer of crystalline silicon to an ultra-shallow (e.g., less than 100 nm) depth which provides a solution to fabrication problems including (1) high thermal conduction in crystalline silicon and (2) shadowing and diffraction-interference effects by an already fabricated gate of a field-effect transistor on incident laser radiation. Such problems, in the past, have prevented prior-art projection gas immersion laser doping from being effectively employed in the fabrication of integrated circuits comprising MOS field-effect transistors employing 100 nm and shallower junction technology. However, a shortcoming of this technique is that the polygate may not be able to stand the high laser fluence without appreciable deformation. Another shortcoming is that undesired silicon melting underneath the trench isolation is likely to occur.

U.S. Pat. No. 4,617,066, entitled, "Process of making semiconductors having shallow, hyperabrupt doped regions by implantation and two step annealing", describes a process for producing hyperabrupt P± or N± regions in a near-surface layer of a substantially defect free crystal, using solid phase epitaxy and transient annealing. The process for producing a hyperabrupt retrograde distribution of the dopant species begins with amorphizing the near-surface layer of a base crystal, and then implanting a steep retrograde distribution of the desired species into the amorphized layer, so that the retrograde distribution lies entirely within the amorphized layer, thereby avoiding channeling effects during implantation. The substantially defect-free structure of the base crystal is restored by annealing the implanted base crystal at a temperature sufficiently high to induce solid phase epitaxial regrowth on the underlying nonamorphized crystal, but at a temperature sufficiently low to avoid significant diffusion of the implanted species. The implanted species is subsequently activated: by a rapid thermal annealing process, at a temperature sufficiently high to activate the implanted species, but for a very short time so that long-range diffusion does not occur. In a preferred embodiment, the implanted species is boron, $BF_2+$, phosphorus, or arsenic in the top 0.20 micrometers of a substantially defect-free silicon base crystal, which may be in a bulk form or epitaxially deposited on an insulator. However, a shortcoming of this technique is that conventional rapid thermal annealing is used, which typically results in diffusion (even over short ranges), which can significantly impact device performance.

U.S. Pat. No. 4,151,008, entitled, "Process involving pulsed light processing of semiconductor devices," discloses a process in which a pulsed laser or flash lamp produces a short duration pulse of light for thermal processing of selected regions of a semiconductor device. The light pulse is directed towards the semiconductor device and irradiates selected surface regions of the device to be processed. Energy deposited by the light pulse momentarily elevates the temperature of the selected regions above threshold processing temperatures for rapid, effective annealing, sintering or other thermal processing. The characteristics of the light pulse are such that only those surface vicinity regions to be processed are elevated to a high temperature and the remaining mass of the semiconductor device is not subjected to unnecessary or undesirable high temperature exposure. However, a shortcoming of this technique is that the dopant concentration cannot go beyond solid solubility limit.

U.S. Pat. No. 4,456,490, entitled, "Laser annealing of MIS devices by back surface laser treatment," discloses a process for fabricating a metal-insulator-semiconductor integrated circuit, including the step of passing a laser beam through a silicon wafer from the back surface to effect localized heating of an insulating layer, upon which is formed metallic circuit paths. However, a shortcoming of this technique is that the absorbing layer needs to remain as part of the structure of the IC, which is not always desirable.

SUMMARY OF THE INVENTION

The present invention relates to semiconductor processing, and more particularly relates to processes of forming an activated doped region in a semiconductor.

A first embodiment of the invention is a process for fabricating a transistor device in a semiconductor substrate having an upper surface, spaced apart shallow trench isolations, and a gate formed on the upper surface between the shallow trench isolations. The process includes the steps of first, forming first amorphous regions in the semiconductor substrate near the upper surface on either side of the gate. The next step is doping the first amorphous regions, thereby forming corresponding first and second doped amorphous extensions. Following the formation of the extensions, the next step is forming side wall spacer structures on either side of the gate. The next step is forming second amorphous regions in the semiconductor substrate adjacent the first and second extensions. The next step is doping the second amorphous regions, thereby forming corresponding doped amorphous deep drain a doped amorphous deep source regions. The next step is forming a strippable conformal layer atop the upper surface of the substrate and the gate. The final step is then performing at least one of front-side irradiation and backside irradiation, thereby providing sufficient heat to the first and second extensions and the deep drain and the deep source regions so as to effectuate activation of the first and second extensions and the deep drain and the deep source regions.

A second embodiment of the invention is also a process for fabricating a transistor device in a semiconductor substrate having an upper surface, spaced apart shallow trench isolations, and a gate formed on the upper surface between the shallow trench isolations. The process according to the second embodiment includes the steps of forming a deep dopant region below the upper surface of the substrate. The next step is then forming first and second amorphous regions in the substrate adjacent the gate and between the upper surface and the deep dopant region. The next step is doping the first and second amorphous regions, thereby forming corresponding first and second extension regions. The next step is then forming second amorphous regions in the semiconductor substrate adjacent the first and second extensions. Following the formation of the extensions, the next step is forming side wall spacer structures on either side of the gate. The next step is then doping the second amorphous regions, thereby forming corresponding doped amorphous deep drain doped amorphous deep source regions respectively having first and second amorphous-crystalline interfaces. The next step is then forming a strippable conformal layer atop the upper surface of the substrate and the gate. Then, the final step is performing at least one of front-side irradiation and backside irradiation, thereby providing sufficient heat to the deep dopant region to effectuate activation of the first and second extensions and the deep drain and the deep source regions.

A third embodiment of the invention is also a process for fabricating a transistor device in a semiconductor substrate having an upper surface, spaced apart shallow trench isolations, and a gate formed on the upper surface between the shallow trench isolations. The process according to the a third embodiment of the invention comprises the steps of first, forming first and second doped extensions the semiconductor substrate near the upper surface on either side of the gate. Following the formation of the extensions, the next step is forming side wall spacer structures on either side of the gate. The next step is then forming doped drain and source regions in the semiconductor substrate adjacent the first and second extensions respectively. The next step is forming a strippable conformal layer atop the upper surface of the substrate and the gate. The final step is then performing at least one of front-side irradiation and backside irradiation, thereby providing sufficient heat to the first and second extensions and the deep drain and the deep source regions so as to effectuate activation of the first and second extensions and the deep drain and the deep source regions.

A fourth embodiment of the invention is a process for fabricating a transistor device in a semiconductor substrate having an upper surface, spaced apart shallow trench isolations, and a gate formed on the upper surface between the shallow trench isolations. The process comprises the steps of first, forming a deep dopant region below the upper surface of the substrate. The next step is then forming first and second doped extensions in the substrate adjacent the gate. Following the formation of the extensions, the next step is forming side wall spacer structures on either side of the gate. The next step is then forming doped deep drain and deep source regions in the substrate between the first and second doped extensions, respectively, and the deep dopant region, the drain and source regions having drain-substrate and source-substrate interfaces, respectively. The next step is then, forming a strippable conformal layer atop the upper surface of the substrate and the gate. The final step is then performing at least one of front-side irradiation and backside irradiation, thereby providing sufficient heat to the deep dopant region to effectuate activation of the first and second extensions and the deep drain and the deep source regions.

Alternate aspects of the above embodiments involve not forming the extensions regions.

In addition, the transistor devices that are formed as a result of the above-described embodiments are further aspects of the present invention.

DETAILED DESCRIPTION OF THE INVENTION

The present invention is a novel semiconductor transistor device having more abrupt dopant profiles and lower sheet resistance, and a process for forming same.

In particular, the present invention is a process of fabricating a semiconductor metal-insulator-semiconductor field effect transistor (MISFET). The insulator in the MISFET could be silicon dioxide ($SiO_2$) or a composite layer of $SiO_2$ with other insulating materials, and the semiconductor therein could be silicon or III–V compounds or Si—Ge alloys or III–V compound alloys. The metal of the MISFET could be, for example, doped polysilicon, aluminum, or a refractory metal.

The formation of a MISFET transistor according to the present invention involves laser thermal processing (LTP) of a silicon (Si) substrate. It will be understood by one skilled in the art that the processes described herein are applicable to, and are generally intended for use in connection with the simultaneous manufacture of large numbers of integrated circuits formed on a semiconductor wafer substrate. Many of the processing steps described below are also described in detail in U.S. patent application Ser. No. 09/286,492, filed on Apr. 5, 1999 by the applicant, which patent application is incorporated herein by reference. Also, the substrate referred to herein is preferably Si, though other known semiconductor substrates could be used. The temperatures cited below refer to Si substrates.

First Embodiment

FIGS. 1A–1F are cross-sectional diagrams outlining the process steps of forming an integrated metal-insulator-semiconductor field-effect transistor (MISFET) device on Si substrate 10 according to a first embodiment of the present invention. Si substrate 10 has a weak dopant concentration (e.g., $10^{15}$–$10^{16}$ ions/cm$^3$).

Figure 1A:
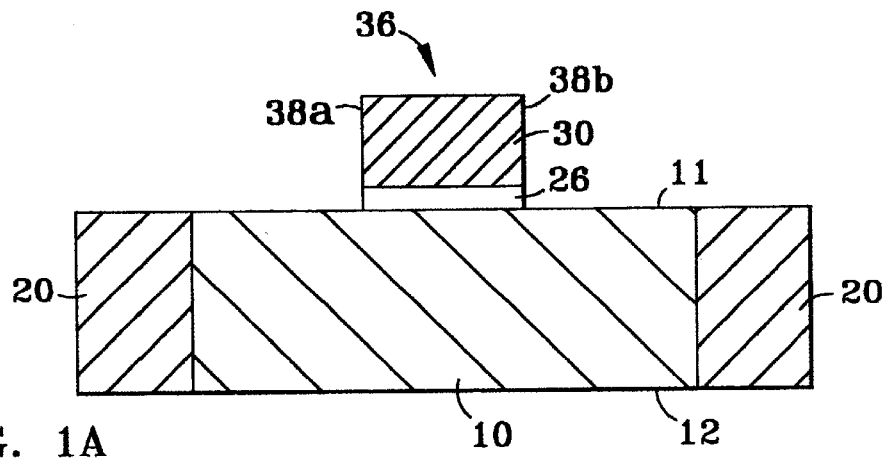
FIGS. 1A–1G are cross-sectional schematic diagrams illustrating the process steps associated with forming a semiconductor transistor device according to first and second aspects of the first embodiment of the present invention.

With reference first to FIG. 1A, semiconductor substrate 10, having an upper surface 11 (also referred to herein as the "front-side") and a lower surface 12 (also referred to herein as the "backside"), is provided. Substrate 10 can be a semiconductor material such as Si, preferably in the form of a single crystal substrate of the kind used in the art of semiconductor device manufacturing.

The first step of the first embodiment of the process is forming spaced apart shallow isolation trenches (STIs) 20 to electrically isolate an area of Si substrate 10 in which the MISFET device is to be formed. STIs 20 are formed by first etching spaced apart trenches into upper surface 12 of Si substrate 10, and then filling the trenches with an insulating material (e.g., an oxide such as silicon dioxide). Upper surface 11 of Si substrate 10 is then chemically-mechanically polished, resulting in a planarized upper surface.

After STIs 20 are formed, the next step is forming a gate using techniques well-known in the art of semiconductor technology. This involves forming a gate insulator layer 26 on upper surface 12 of Si substrate 10. Gate insulator layer 26 can be an oxide layer, for example, in which case the resulting device is a MOSFET. A poly-silicon or amorphous silicon layer 30 is then deposited by low-pressure chemical vapor deposition, for example, atop gate insulator layer 26. Silicon layer 30 and gate insulator layer 26 are then patterned using a resist layer to selectively form or etch the silicon layer 30 and the gate insulator layer 26 to form the silicon gate body ("gate") 36, which includes a portion of gate insulator layer 26. Gate 36, as represented in the cross-sectional view of FIG. 1A, has first and second sides 38a and 38b.

Figure 1B:
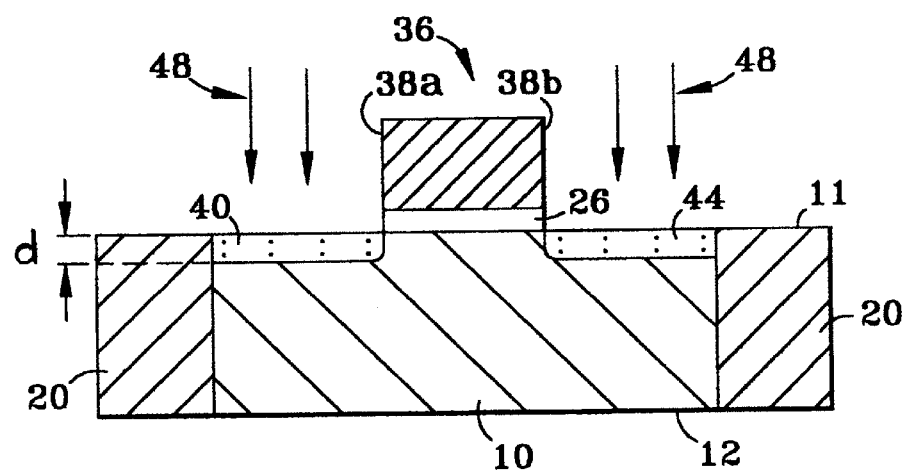

With reference now to FIG. 1B, the next step of the present embodiment involves forming doped extensions by first amorphizing regions 40 and 44, respectively, of Si substrate 10 on near upper surface 11 on either side of gate 36. For the formation of extensions, this depth is preferably between 20–30 nanometers. A preferred process for performing this amorphizing step is through an ion implantation process, indicated by arrows 48. The implanted ions destroy the chemical bonds between silicon atoms in Si substrate 10 so that the atomic structure therein is made relatively disordered and random, as compared with the portions of the Si substrate 10 that are not subjected to such ion bombardment. Preferably, the ion species, the implantation energy and the dosage are selected to amorphize regions 40 and 44 to a predetermined depth d. In general, selecting an ion species with a relatively light atomic weight, and/or increasing the ion implantation energy in ion implantation process 48 will each have the effect of increasing the amorphization depth d. Conversely, selecting an ion species with relatively heavy atomic weight, and/or decreasing the ion implantation energy in ion implantation process 48 will each have the effect of decreasing the amorphization depth d. A number of ion species can be used to produce the amorphous regions. For example, the ion species can include silicon, argon, arsenic, or germanium. The ion implantation energy can be in a range from 2 to 100 kilo-electronVolts (keV) at a dosage in a range from $10^{13}$ to $10^{16}$ ions/cm$^2$. In a preferred embodiment, the depth d to which amorphized regions 40 and 44 extend into Si substrate 10 is predetermined to be less than 100 nanometers. To produce an amorphization depth d of 30 nanometers, it is preferable that germanium ions implanted at an energy of about 20 keV with a dosage of about $3\times10^{14}$ atoms/cm$^2$ be used. However, the implanted species can be Si, Ge, Ar, As, P, Xe, Sb, and In. An implant energy between .2 keV to 100 keV is generally preferred, and the implant dose is preferably in the range from $1\times10^{13}$ atoms/cm$^2$ to $1\times10^{16}$ atoms/cm$^2$. Implantation of amorphizing dopants can be performed with known apparatus, such as the 9500 XR ION IMPLANTER™, commercially available from Applied Materials, Inc., San Jose, Calif.

Figure 1C:
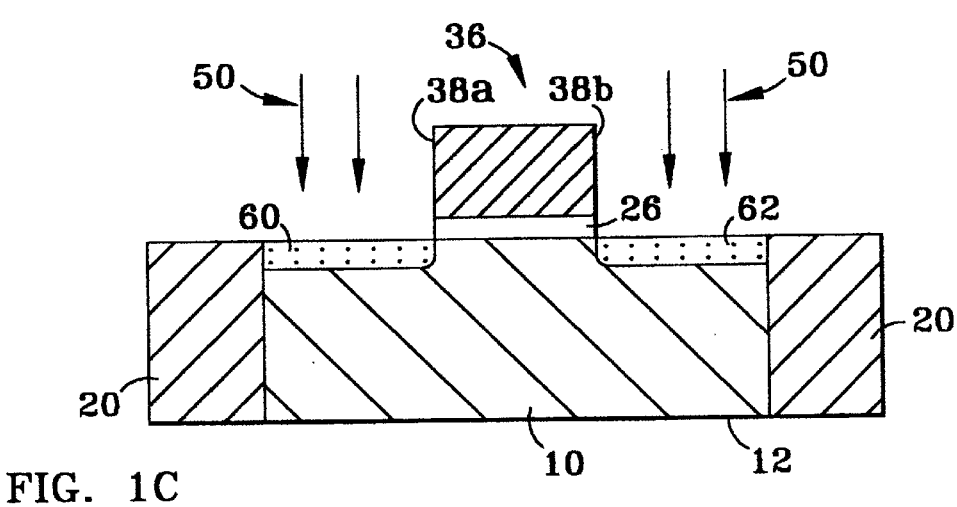

With reference now to FIG. 1C, amorphized regions 40 and 44 are then doped with appropriate n- or p-type dopants, as indicated by dopant implant beam 50. Doping is performed using p-type dopant ions (e.g., boron, aluminum, gallium, beryllium, magnesium, or zinc) or n-type dopant ions (e.g., phosphorous, arsenic, antimony, bismuth, selenium, and tellurium) from an ion implanter, such as the one mentioned above. The ions are accelerated to a given energy level (e.g., 200 eV to 40 KeV) and implanted in amorphized regions 40 and 44 through upper surface 11 to a given dose (e.g., about $1\times10^{14}$ atoms/cm$^2$ to $1\times10^{16}$ atoms/cm$^2$), thereby forming doped extensions 60 and 62. The latter have, in practice, a concentration of dopant that varies with depth into substrate 10 from upper surface 11, and is typically between $10^{13}$–$10^{22}$ ions/cm$^3$. The first and second steps of the present embodiment can be interchanged to achieve the same effect. The first (amorphization) step may be omitted completely if the dopant implant carried out to introduce dopants into the extensions of substrate 10 to be activated also amorphizes regions 40 and 44. In practice, any one of a number of conventional dopant implant techniques can be used to form extensions 60 and 62. Further, the dopant implantation step can be skipped all together, leaving regions 40 and 44 undoped.

If Si substrate 10 is p-type, extensions 60 and 62 are doped with n-type dopants. On the other hand, if Si substrate 10 is n-type, then extensions 60 and 62 are doped with p-type dopants.

Figure 1D:
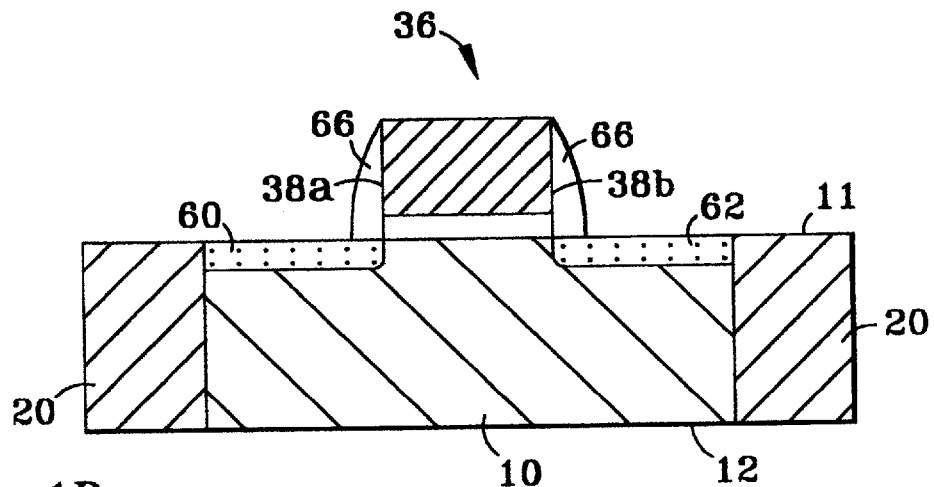

With reference now to FIG. 1D, the next step of the present embodiment is forming sidewall spacers 66. This is accomplished by forming an insulator layer (not shown) atop upper surface 11 of Si substrate 10 and gate 36. This insulator layer is then etched to form insulator sidewall spacers 66 on sides 38a and 38b, respectively, of gate 36. Sidewall spacers 66 help to achieve self-alignment of the position of the deep drain and deep source regions yet to be formed, and also prevent horizontal diffusion into gate 36.

Figure 1E:
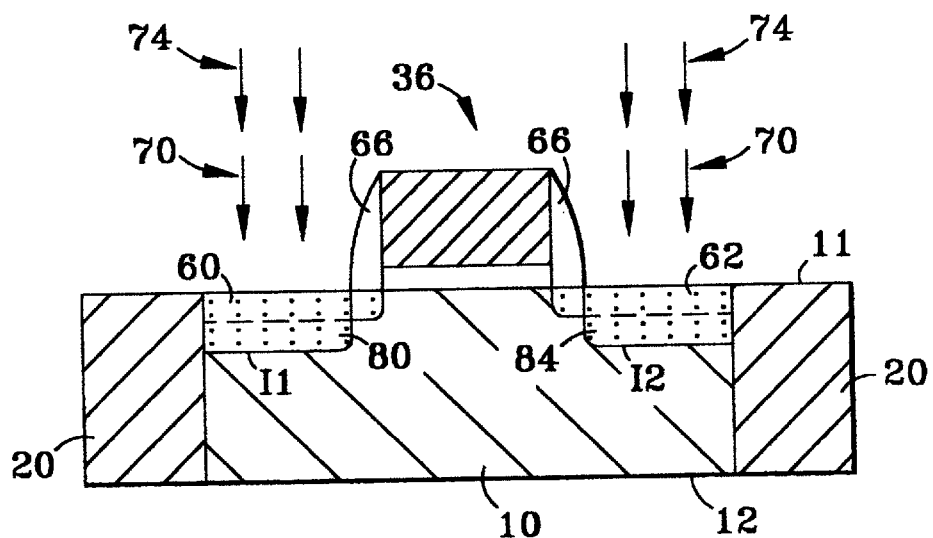

With reference now to FIG. 1E, the next step of the present embodiment involves performing a second deeper amorphizing implant 70 and a second deeper dopant implant 74 beneath extensions 60 and 62 (see FIG. 1D), thereby respectively forming a doped deep drain region 80 and a doped deep source region 84. Deeper dopant implant 74 is typically at a higher dose than used in doping extensions 60 and 62 (e.g., $10^{14}$–$10^{16}$ ions/cm$^3$), so that the dopant concentration is higher in drain and source regions 80 and 84 than in extensions 60 and 62. Also, the depth of drain and source regions 80 and 84 preferably extends to about 50 nanometers below upper surface 11. This process leaves a portion of extensions 60 and 62 beneath sidewall spacers 66. A first amorphous-crystalline interface I1 separates drain region 80 and crystalline Si substrate 10, and a second amorphous-crystalline interface I2 separates source region 84 from the crystalline Si substrate 10.

Figure 1F:
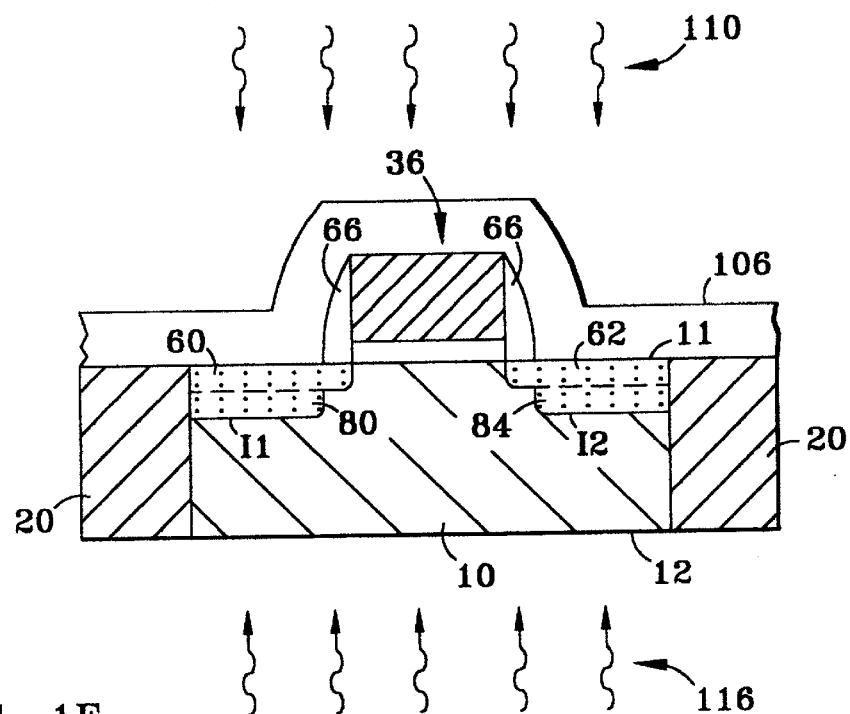

With reference now to FIG. 1F, the next step of the present embodiment involves depositing a strippable conformal layer 106 over upper surface 11, including extensions 60 and 62, gate 36 and sidewall spacers 66. Conformal layer 106 needs to be capable of withstanding high temperatures, i.e., temperatures in excess of the Si melting temperature of 1410° C. The material making up conformal layer 106 must also be easily removable without impacting the layers or regions below. One role of conformal layer 106 is to maintain the physical structure of the device during processing. Another role of conformal layer 106 is to absorb energy from a wavelength of light used in laser thermal process and to redistribute this absorbed energy as heat to the structure below. An exemplary material for conformal layer 106 is tantalum (Ta), deposited to a thickness of between 100 and 1000 angstroms via sputtering or by CVD. Other preferred materials for conformal layer 40 include titanium (Ti), titanium nitride (TiN), tantalum (Ta), tungsten nitride (WN), oxide, nitride, or combination of these. An oxide or nitride layer may need to be deposited as part of conformal layer 106 to adjust the reflectivity of the conformal layer.

With continuing reference to FIG. 1F, a first alternative for the seventh step of the present embodiment is to perform laser annealing of the structure by irradiating conformal layer 106 and through upper surface 11 of substrate 10 with a radiation beam 110. This process is referred to herein as "front-side irradiation". Radiation beam 110 is preferably from a laser emanating pulsed light having a wavelength of between 0.1 and 0.6 microns, a temporal pulse width of less than 1 ms, and an irradiance between 0.1 to 1000 J/cm$^2$ per pulse. Conformal layer 106 may be made of a transparent material, such as silicon dioxide, so as to maximize the laser energy absorbed by drain and source regions 80 and 84 and extensions 60 and 62. In this case, conformal layer 106 serves mainly to keep the junction structure together, while also preferably serving as an antireflection coating. The energy absorbed in regions 80 and 84 and extensions 60 and 62 is designed to be sufficient to heat these regions to a temperature in the range of 800° C. to 1100° C. This temperature range is sufficient to activate regions 80 and 84 and extensions 60 and 62 without melting. Alternatively, the temperature of regions 80 and 84 and extensions 60 and 62 may be made high enough (e.g., in excess of 1100° C., but preferably less than 1410° C., the melting temperature of substrate 10) to melt these regions and the extensions to achieve activation upon recrystallization.

Conformal layer 106 may also be made of an opaque material so as to couple energy from radiation beam 110 into the underlying structure. In this case, radiation beam 110 preferably has a wavelength of between 0.1 and 20 microns, a temporal pulse width of less than 1 ms, and an irradiance between 0.1 to 1000 J/cm$^2$ per pulse. The energy from radiation beam 110 is designed so that it is absorbed in conformal layer 106 so that regions 80 and 84 and extensions 60 and 62 are heated sufficiently to a temperature in the range of 800° C. to 1100° C., i.e., sufficient to activate the regions and the extensions without melting them. Also, as discussed above, alternatively, the temperature of conformal layer 106 may be made high enough (e.g., in excess of 1100° C.) to melt regions 80 and 84 and extensions 60 and 62 to achieve activation upon recrystallization.

With continuing reference to FIG. 1F, in an alternative to the above-described step of front-side irradiation, the same effect may be achieved by irradiating lower surface 12 of substrate 10 with a radiation beam 116. This process is referred to herein as "backside irradiation". In this case, lower surface 12 of substrate 10 should be polished to avoid light loss due to surface scattering. Radiation beam 116 preferably has a wavelength between 1 to 20 microns, a temporal pulse length of less than 1 ms, and an irradiance between 0.1 to 1000 J/cm$^2$. Radiation beam 116 passes through substrate 10 without significant attenuation, but is absorbed by conformal layer 106. Heat from heated conformal layer 106 then diffuses into substrate 10 and heats drain and source regions 80 and 84 and extensions 60 and 62 to a temperature between 800° C. and 1100° C., which is sufficient to activate the regions and extensions without melting them. Alternatively, the temperature of drain and source regions 80 and 84 and extensions 60 and 62 may be made high enough (e.g., in excess of 1100° C.) through backside irradiation to melt the regions and the extensions to achieve activation upon recrystallization. The preferred conformal layer 106 is made out of opaque materials, which absorb light at wavelengths between 1 to 20 microns, since the layer absorbs radiation first passing through substrate 10 from lower surface 12. Also, where the wavelength of the radiation beam is such that it is absorbed by source and drain regions 80 and 84 and extensions 60 and 62, conformal layer 106 may comprise a material that reflects heat, such as aluminum. In this case, conformal layer 106 acts to direct any radiation that passes through to upper surface 11 back into drain and source regions 80 and 84 and extensions 60 and 62, further heating these regions.

In another alternative to separate front-side irradiation and back-side irradiation, both backside and front-side irradiation using both radiation beams 110 and 116 can be used to achieve activation of drain and source regions 80 and 84, and extensions 60 and 62. In this case, radiation beam 110 has an irradiance sufficient to heat drain and source regions 80 and 84 and extensions 60 and 62 to a temperature up to <1100° C. Radiation beam 110 is preferably from a laser emanating pulsed light having a wavelength of between 0.1 and 20 microns, a temporal pulse width of less than 1 ms, and an irradiance between 0.1 to 1000 j/cm$^2$ per pulse. In combination therewith, lower surface 12 of substrate 10 is irradiated (backside irradiation) with radiation beam 116 having a wavelength between 1 to 20 microns, a temporal pulse length of less than 1 ms, and an irradiance between 0.1 to 1000 J/cm$^2$. The heating caused by the front-side radiation, can enhance the absorption of back-side radiation beam 116. Radiation beam 116 passes through substrate 10 from lower surface 12 to upper surface 11 without significant attenuation, and is absorbed near the upper surface 11 in the substrate or in the conformal layer 106. The irradiance of radiation beam 116 is designed to further heat the upper surface 11 to a temperature between 800° C. and 1100° C., which is sufficient to activate regions 80 and 84, and also extensions 60 and 62. Also, in this alternative embodiment, the temperature of regions 80 and 84 and extensions 60 and 62 may be made high enough (e.g., in excess of 1100° C.) to melt the regions and the extensions to achieve activation upon recrystallization by dopant trapping.

After irradiation is performed using one of the irradiation alternatives discussed above, in the next step, conformal layer 106 is stripped away, using for example concentrated hydrofluoric acid.

Figure 1G:
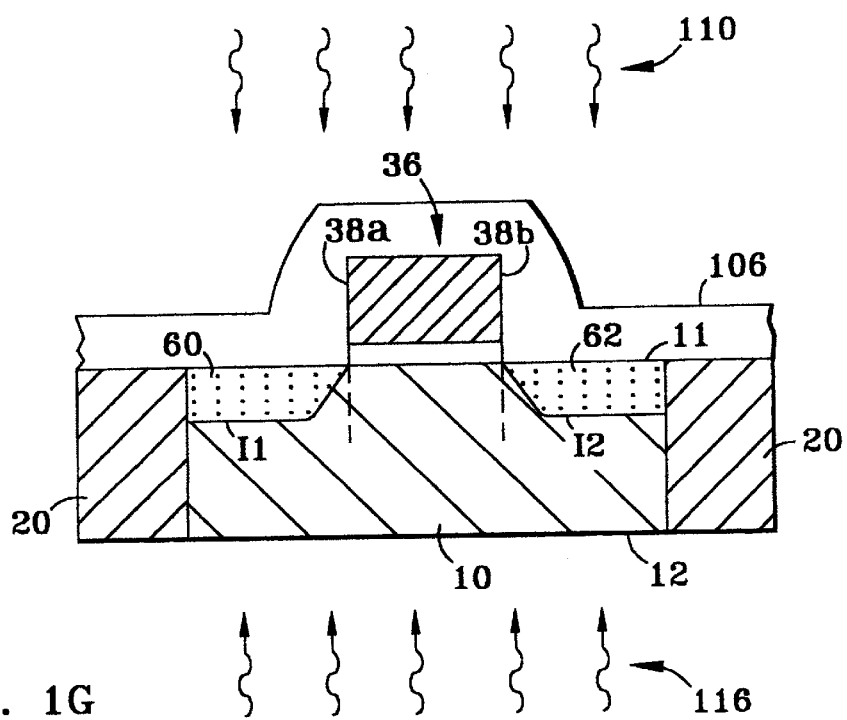

With reference to FIG. 1G, in a second aspect of the present embodiment, the process follows the steps described above, through to FIG. 1C. However, rather than forming extensions 60 and 62 in the manner described above, only the implant 48 is carried out to form drain and source regions 80 and 84 that extend down to about 50 nanometers, and extend laterally within Si substrate 10 so as to reach to the sides 38a and 38b, as extended into the substrate from upper surface 11, as indicated by the dashed lines in FIG. 1G. In this aspect of the present embodiment, irradiation to activate drain and source regions 80 and 84 is carried out as described above in connection with the first aspect of the embodiment with reference to FIG. 1F (the steps illustrated in FIGS. 1D and 1E are not used here).

Figure 2:
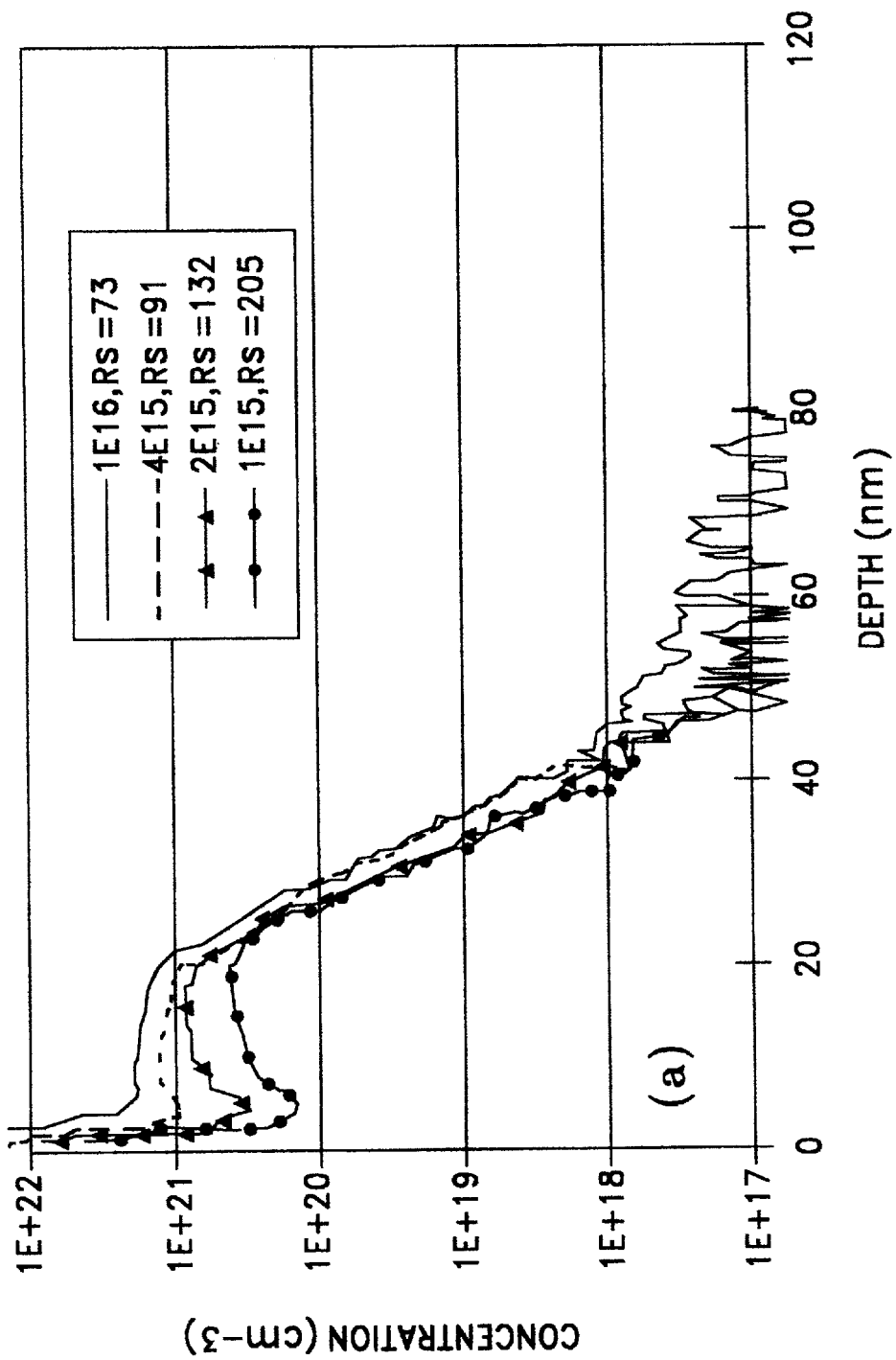
FIG. 2 is a plot of SIMS profiles of boron in silicon at different implant doses and the associated sheet resistance values for drain and source regions formed using the process according to the present invention.

The process of the present invention as described above with respect to both aspects of the first embodiment results in activate drain and source regions 80 and 84 (and also extensions 60 and 62 in the first aspect of the embodiment), wherein the dopant profile is very shallow (on the order of 50 nm), has a sharply defined boundary, and has a very low sheet resistance, as indicated by the curves in FIG. 2.

The dopant concentration in the laser annealed regions (and extensions) that results is also much higher (e.g., on the order of $10^{21}$ cm$^{-3}$) and relatively scales with implant doses, while in comparison, for regions annealed using conventional RTA, the dopant concentration saturates at about $3 \times 10^{20}$ cm$^{-3}$. For a boron implant dose of $1 \times 10^{16}$ cm$^{-2}$, the sheet resistance obtained using the present process is about 73 Ω/sq (see FIG. 2). It is believed this represents the lowest sheet resistance reported for drain and source regions having a depth of 50 nanometers or shallower. It also indicates that the activated dopant concentration is above $10^{21}$ cm$^{-3}$, which is higher than the solid solubility limit.

Second Embodiment

Figure 3A:
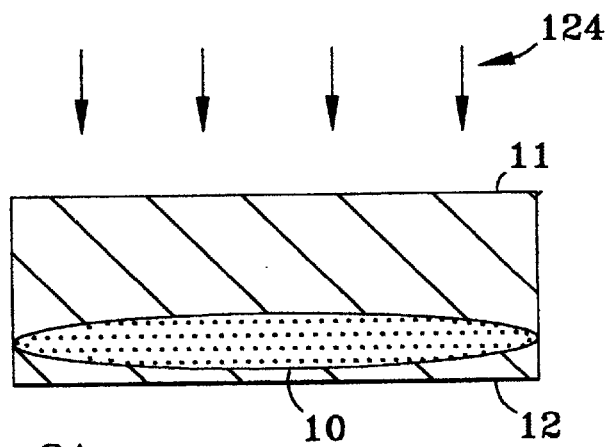
FIG. 3A is a cross-sectional schematic diagram illustrating the formation of a deep dopant layer in a substrate.
Figure 3B:
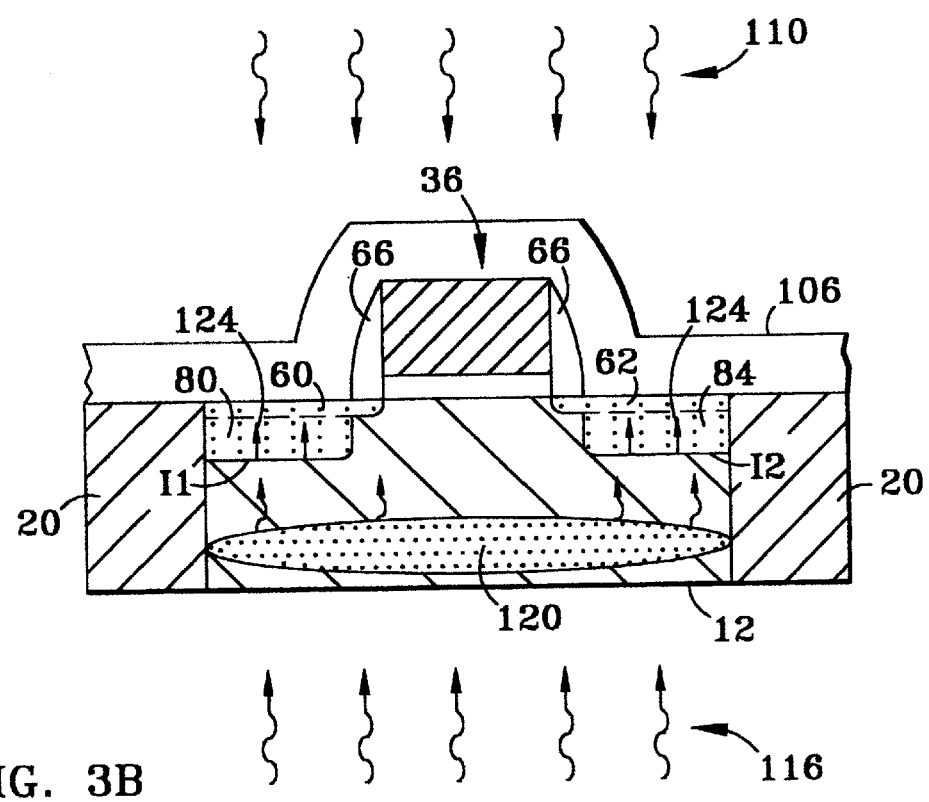
FIG. 3B is a cross-sectional schematic diagram illustrating the essential components of a semiconductor transistor device and the employment of front-side and/or backside irradiation in the processing of the device according to a first aspect of the second embodiment of the process according to the present invention, wherein the device includes extension regions.
Figure 3C:
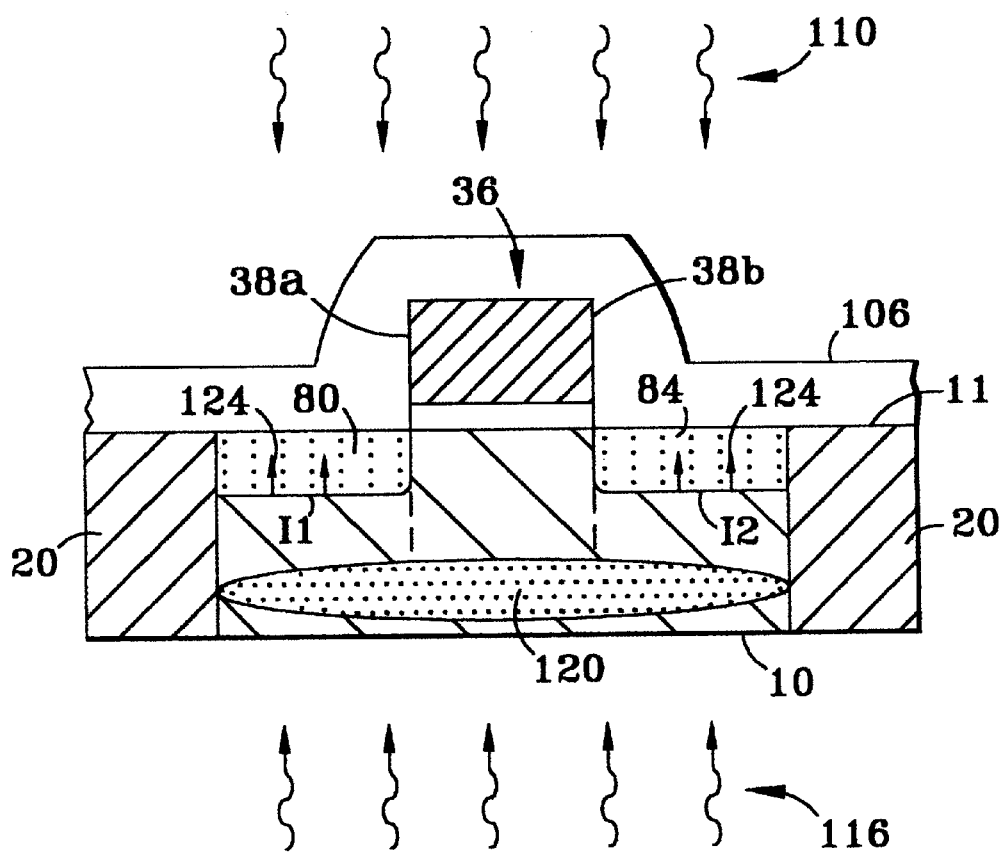
FIG. 3C is a cross-sectional schematic diagram illustrating the essential components of a semiconductor transistor device and the employment of front-side and/or backside irradiation in the processing of the device according to a second aspect of the second embodiment of the process according to the present invention, wherein the device includes only drain and source regions without extension regions.

With reference now to FIGS. 3A–3C, a second embodiment of the process of the present invention is now described. Where the same components and structures from the first embodiment are used, the same reference numbers are also used. Like the first embodiment, the present embodiment begins with the step of providing substrate 10.

However, with reference to FIG. 3A, unlike the first embodiment, a deep, activated doped region 120 ("deep dopant region") is formed within substrate 10. Region 120 may be formed, for example, by ion implanting dopant ions using an ion beam 124 having a dose range from $10^{12}$–$10^{16}$ atoms/cm$^2$ to a depth of approximately 0.1 μm to 10 μm, and then performing a rapid thermal anneal (RTA) of the substrate to activate the region. Alternatively, the dopants may be deposited at or near upper surface 11 and then diffused into substrate 10 to the desired depth. The relatively high dopant concentration of region 120 causes increased absorption of light in the 1–20 μm wavelength range within the region. Accordingly, light having a wavelength between 1–20 microns will pass through crystalline substrate 10 (which has a doping concentration less than $10^{16}$ ions/cm$^3$ and hence a lower absorption), but will be absorbed in region 120. This absorbed light then heats region 120.

The next steps in the first aspect of the present embodiment are the same as those of the first embodiment, as described with reference to FIGS. 1A–1F. However, the mechanism for activating drain and source regions 80 and 84 and extensions 60 and 62 are as described below.

Thus, with reference now to FIG. 3B, the next step of the present embodiment, following the process step of FIG. 1F, is the performance of front-side irradiation with radiation beam 110, as described above in connection with the first embodiment. Radiation beam 110 is preferably pulsed laser light of a wavelength of 0.1 to 20 microns, with an irradiance of 0.1 to 1000 J/cm$^2$, and having a temporal pulse length shorter than 1 ms. Conformal layer 106 can either be transparent or opaque, as described above.

For a transparent conformal layer 106, radiation beam 110 preferably has a wavelength range from 0.6 to 20 μm. Energy from radiation beam 110 is transferred from conformal layer 106 to substrate 10 and is absorbed by deep dopant region 120, which then releases the absorbed energy as heat. This heat diffuses toward interfaces I1 and. I2, as indicated by arrows 122. A temperature gradient then forms at interfaces I1 and I2. It is noted that deep dopant region 120 may be formed so that it is immediately adjacent drain and source regions 80 and 84, so that interfaces I1 and I2 form the boundary between these regions and the deep dopant region.

When a sufficiently high temperature is reached at interfaces I1 and I2 (e.g., 1100° C., the melting temperature of amorphous silicon), regions 80 and 84 undergo explosive recrystallization, in which a moving melt front (as indicated by arrows 124) propagates toward upper surface 11 of substrate 10. The explosive recrystallization occurs when the molten Si starts to solidify into crystalline Si from the primary melt at interfaces I1 and I2. The latent heat released by this solidification melts a thin layer of the overlying doped amorphous regions 80 and 84 immediately adjacent interfaces I1 and I2. Latent heat is again released during crystallization of this secondary melt and thus a thin liquid Si layer propagates from the original liquid-solid interfaces I1 and I2 to surface 11 of substrate 10. This process is quenched at conformal layer 106, since the melting temperature of the conformal layer is higher than that of drain and source regions 80 and 84 (or amorphous Si generally).

Alternatively, front-side irradiation is performed as above, but with an amount of irradiance designed to provide energy to deep dopant region 120 so that heat from deep dopant region 120 heats drain and source regions 80 and 84 to a temperature between 800° C. to 1100° C., which is sufficient to activate regions 80 and 84 without melting them.

An alternative to performing front-side irradiation is backside irradiating lower surface 12 of substrate 10 with radiation beam 116 having a wavelength from 1 to 20 microns, an irradiance of 0.1 to 1000 J/cm$^2$ and a temporal pulse length shorter than 1 ms. In this case, lower surface 12 should be polished to avoid light loss due to surface scattering. Radiation beam 116 travels through substrate 10 and is absorbed in deep dopant region 120. This heat is release and diffuses outward, forming a temperature gradient at interfaces I1 and I2, which causes explosive re-crystallization of regions 80 and 84 once to the temperature at interfaces I1 and I2 exceed about 1100° C. The recrystallization propagates toward upper surface 11 of substrate 10, thereby activating drain and source regions 80 and 84, as well as extensions 60 and 62. Alternatively, deep dopant region 120 is irradiated using backside irradiation, which then provides heat to drain and source regions 80 and 84 sufficient to activate the regions without melting them, as described above. Conformal layer 106, as described above, can be made of reflecting, transparent, or opaque materials.

An alternative to separately using front-side or backside irradiation is using both front-side and backside irradiation via radiation beams 110 and 116, respectively, to form the thermal gradient at interfaces I1 and I2, so as to initiate explosive recrystallization, which activates drain and source regions 80 and 84 and extensions 60 and 62, as described above. Alternatively, sufficient heat can be added to drain and source regions 80 and 84 and extensions 60 and 62 via front side irradiation such that, when combined with the heat provided by the explosive recrystallization, drain and source regions 80 and 84 and extensions 60 and 62 melt and recrystallize to achieve activation. Another alternative is to heat deep dopant region 120 with radiation beam 116 and then further heat drain and source regions 80 and 84 and extensions 60 and 62 with radiation beam 110 to a temperature sufficient to activate the regions and the extensions without melting them. Conformal layer 106 may be made of transparent or opaque materials. For front-side irradiation, the wavelength of radiation beam 110 is preferably in the range from 0.1 to 20 microns. For backside irradiation, the wavelength of radiation beam 116 is preferably in the range from 1 to 20 microns.

With reference now to FIG. 3C, in a second aspect of the present embodiment, the process follows the steps described above in connection with the first embodiment, from FIG. 1A, through to FIG. 1C, and further includes the step of forming deep dopant region 120 (FIG. 3A). However, rather than forming extensions 60 and 62, amorphizing and dopant implants 48 and 50 (FIGS. 1B and 1C) are carried out to directly form drain and source regions 80 and 84 that extend down to about 50 nanometers, and that extend laterally within substrate 10 to sides 38$a$ and 38$b$, as extended into the substrate as indicated by the dashed lines. In this aspect of the present embodiment, with reference to FIG. 3C, irradiation to activate drain and source regions 80 and 84 is carried out as described above in connection with the various alternatives described in the first aspect of the present embodiment.

The process of the present invention as described above with respect to the above described embodiments results in activate drain and source regions 80 and 84 (and, in certain aspects of the embodiment, extensions 60 and 62), wherein the dopant profile is very shallow (on the order of 50 nm), has a sharply defined boundary, and has a very low sheet resistance, as indicated by the curves in FIG. 2.

The dopant concentration in the laser annealed regions (and extensions) that results is also much higher (e.g., on the order of $10^{21}$ cm$^{-3}$) and relatively scales with implant doses, while in comparison, for regions annealed using conventional RTA, the dopant concentration saturates at about $3 \times 10^{20}$ cm$^{-3}$. For a boron implant dose of $1 \times 10^{16}$ cm$^{-2}$, the sheet resistance obtained using the present process is about 73 $\Omega$/sq (see FIG. 2). It is believed this represents the lowest sheet resistance reported for drain and source regions having a depth of 50 nanometers or shallower. It also indicates that the activated dopant concentration is above $10^{21}$ cm$^{-3}$, which is higher than the solid solubility limit.

Third Embodiment

Figure 4A:
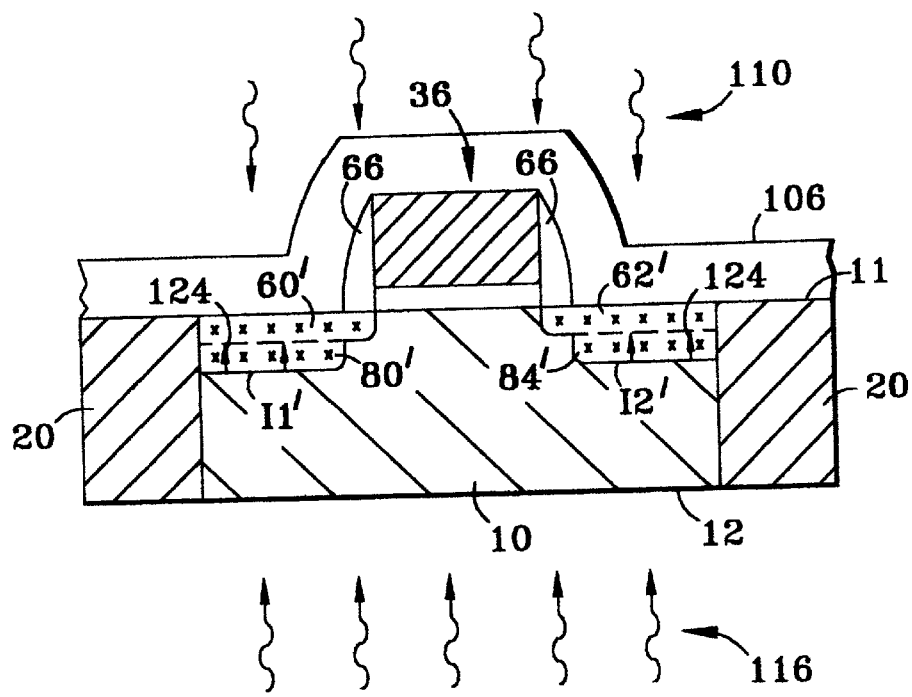
FIG. 4A is a cross-sectional schematic diagram illustrating the essential components of a semiconductor transistor device and the employment of front-side and/or backside irradiation in the processing of the device according to a first aspect of the third embodiment of the process according to the present invention, wherein the device includes extension regions.
Figure 4B:
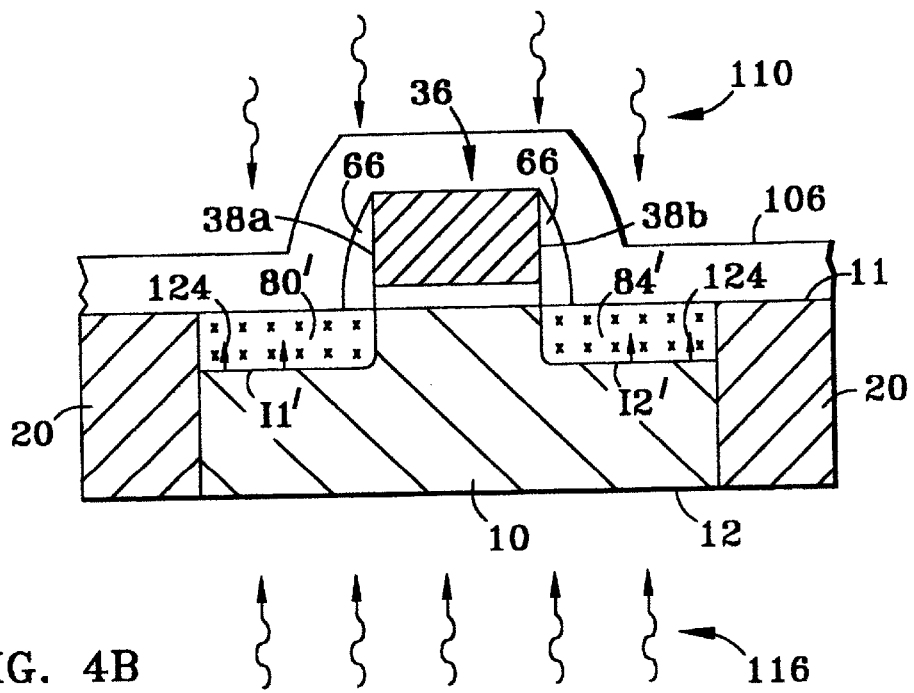
FIG. 4B is a cross-sectional schematic diagram illustrating the essential components of a semiconductor transistor device and the employment of front-side and/or backside irradiation in the processing of the-device according to a second aspect of the third embodiment of the process according to the present invention, wherein the device includes only drain and source regions without extension regions.

With reference now to FIGS. 4A and 4B, a third embodiment of the process of the present invention is now described. The present embodiment follows essentially the same steps of the two aspects of the first embodiment described above in connection with FIGS. 1A–1G. However, unlike the first embodiment, there is no amorphizing implants 48 or 70. Thus, with reference to. FIGS. 4A and 4B, rather than forming doped amorphous extensions 60 and 62 and/or doped amorphous drain and source regions 80 and 84 (FIG. 1E), in the present embodiment, doped extensions 60' and 62' and/or doped drain and source regions 80' and 84' that are formed are essentially crystalline. Accordingly, the interfaces between drain region 80' (or source region 84', and the substrate are dopant-substrate interfaces I1' and I2', in analogy to amorphous-crystalline interfaces I1 and I2.

Accordingly, with reference to FIG. 4A, as in the first embodiment, once the structure shown therein is created using the steps corresponding to FIGS. 1A and 1C–1E described above in connection with the first embodiment (i.e., the steps that correspond to FIGS. 1A–1E without performing the amorphizing implants 48 or 70), the next step in the process is performing front side irradiation with radiation beam 110 having a wavelength of between 0.1 and 20 microns, a temporal pulse width of less than 1 ms, and an irradiance between 0.1 to 1000 J/cm$^2$ per pulse.

If a conformal layer 106 is present and made of a transparent material, radiation beam 110 is absorbed by drain and source regions 80' and 84' and extensions 60' and 62'. The energy from this absorption is sufficient to heat drain and source regions 80' and 84' and extensions 60' and 62' to a temperature between 800° C. and 1410° C., which is sufficient to activate the regions and the extensions without melting them or the crystalline substrate 10, the latter having a melting temperature of about 1410° C. Also, in an alternative embodiment, the temperature of drain and source regions 80' and 84' and extensions 60' and 62' may be made high enough to melt the regions and the extensions to achieve activation upon recrystallization, as described above.

If conformal layer 106 is made of an opaque material, then radiation beam 110 is absorbed by the conformal layer. Heat from this absorption is diffused to drain and source regions 80' and 84' and extensions 60' and 62'. This heat is designed to be sufficient to heat drain and source regions 80' and 84' and extensions 60' and 62' to a temperature between 800° C. and 1410° C., which is sufficient to activate the regions and the extensions without melting them. In an alternative embodiment, the temperature of drain and source regions 80' and 84' and extensions 60' and 62' may be made high enough to melt the regions and the extensions to achieve activation upon recrystallization.

In an alternative to front-side irradiation, the same effect may be achieved by irradiating substrate 10 with backside irradiation via radiation beam 116. In this case, lower surface 12 should be polished to avoid light loss due to surface scattering. As in the embodiments described above, radiation beam 116 preferably has a wavelength between 1 to 20 microns, a temporal pulse length of less than 1 ms, and an irradiance between 0.1 and 1000 J/cm$^2$. Radiation beam 116 travels through lower surface 12 of substrate 10, and is absorbed in drain and source regions 80' and 84'. Radiation beam 116 is absorbed by drain and source regions 80' and 84' and by extensions 60' and 62' and heat the regions and the extensions to a temperature of 800° C. and 1100° C., which is sufficient to activate the regions without melting the region. Also, in an alternative embodiment, the temperature of drain and source regions 80' and 84' and extensions 60' and 62' may be made high enough to briefly melt the regions and the extensions to achieve activation upon recrystallization. Also, in this case, conformal layer 106 may comprise a material that reflects heat, such as aluminum. Thus, conformal layer 106 acts to direct any light that passes through to upper surface 11 back into regions 80' and 84' and extensions 60' and 62' further heating the regions and the extensions. Also, as discussed above in connection with the previous embodiments, conformal layer 106 may also be made out of transparent or opaque materials.

In an alternative to separately performing front-side and backside irradiation, both backside and front-side irradiation is performed with radiation beams 110 and 116, respectively, to achieve activation of drain and source regions 80' and 84' and extensions 60' and 62'. In this case, radiation beam 110 preferably has an irradiance sufficient to heat regions 80' and 84' to a temperature up to 1000° C. The wavelength of radiation beam 110 should be 0.1 to 20 microns if a conformal layer 106 is present. In combination therewith, radiation beam 116 irradiates substrate 10 through lower surface 12, with radiation beam 110 having a wavelength of between 1 to 20 microns, a temporal pulse length of less than 1 ms, and an irradiance between 0.1 and 1000 J/cm$^2$. Radiation beam 116 is designed to heat drain and source regions 80' and 84' and extensions 60' and 62' to a temperature sufficient to activate the regions and the extensions without melting them. Also, in this alternative embodiment, the temperature of drain and source regions 80' and 84' and extensions 60' and 62' may be made high enough to briefly melt the regions and the extensions to achieve activation upon recrystallization. Also, in this case, conformal layer 106, if present, may comprise a material that reflects heat, such as aluminum. Thus, conformal layer 106 in this instance acts to direct radiation that makes it to upper surface 11 back into drain and source regions 80' and 84' and extensions 60' and 62', further heating the regions and the extensions. On the other hand, conformal layer 106 may be made of either transparent or opaque materials, and function as a member for holding the structure together, or as an absorbing member, respectively.

With reference to FIG. 4B, in a second aspect of the present embodiment, the process follows the steps described above in connection with FIGS. 1A–1C of the first embodiment. However, rather than forming extensions 60 and 62, dopant implants 48 and 50 are carried out to directly form drain and source regions 80' and 84' that extend down to about 50 nanometers, and that extend laterally within substrate 10 to sides 38a and 38b, as extended into the substrate, as indicated by the dashed lines. In this aspect of the present embodiment, with reference to FIG. 4B, irradiation to activate drain and source regions 80' and 84' is carried out as described above in connection with the various alternatives described in the first aspect of the present (third) embodiment.

The process of the present invention as described above with respect to this third embodiment results in activated drain and source regions 80' and 84' (and also extensions 60' and 62' in the first aspect of the present embodiment), wherein the dopant profile is very shallow (on the order of 50 nm), has a sharply defined boundary, and has a very low sheet resistance, as indicated by the curves in FIG. 2.

The dopant concentration in the laser annealed drain ad source regions (and extensions) that results is also much higher (e.g., on the order of $10^{21}$ cm$^{-3}$) and relatively scales with implant doses, while in comparison, for regions annealed using conventional RTA, the dopant concentration-saturates at about $3 \times 10^{20}$ cm$^{-3}$. For a boron implant dose of $1 \times 10^{16}$ cm$^{-2}$, the sheet resistance obtained using the present process is about 73 Ω/sq (see FIG. 2). It is believed this represents the lowest sheet resistance reported for drain and source regions having a depth of 50 nanometers or shallower. It also indicates that the activated dopant concentration is above $10^{21}$ cm$^{-3}$, which is higher than the solid solubility limit.

Fourth Embodiment

Figure 5A:
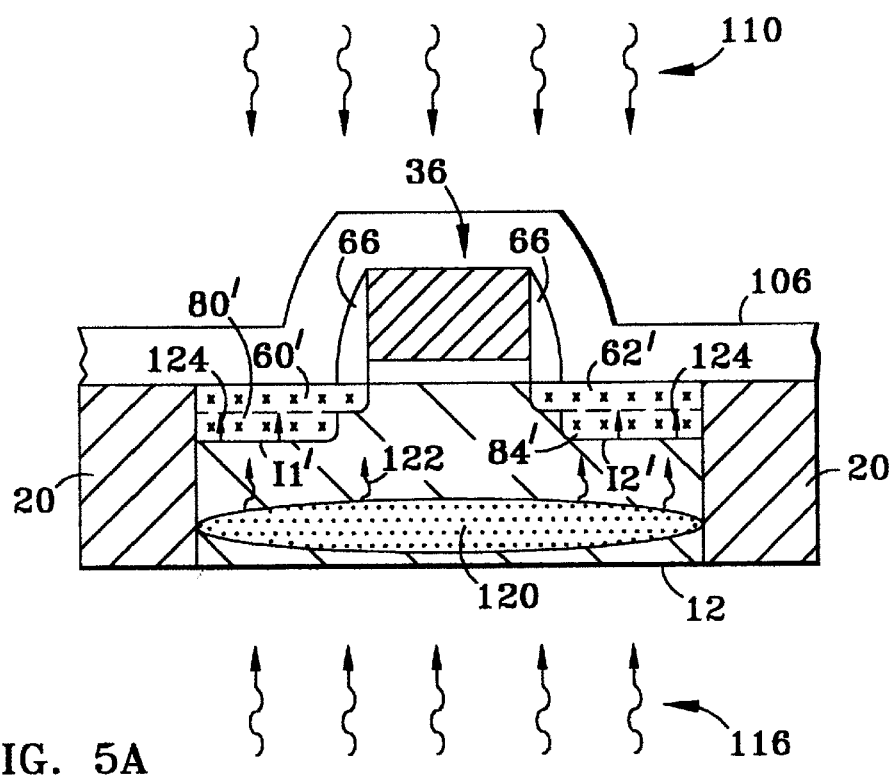
FIG. 5A is a cross-sectional schematic diagram illustrating the essential components of a semiconductor transistor device and the employment of front-side and/or backside irradiation in the processing of the device according to a first aspect of the fourth embodiment of the process according to the present invention, wherein the device includes extension regions.
Figure 5B:
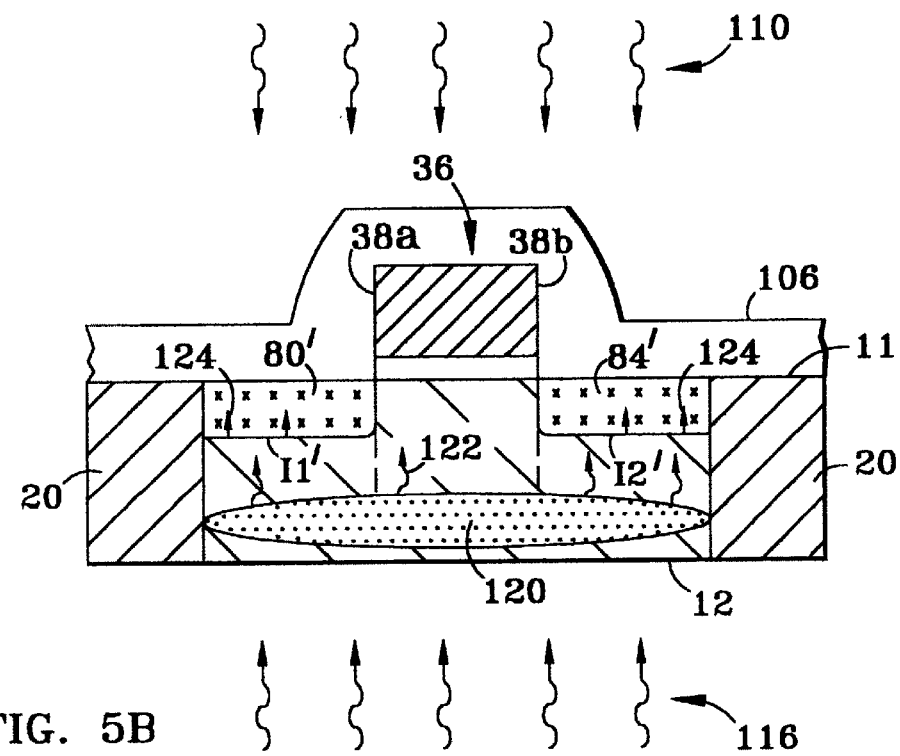
FIG. 5B is a cross-sectional schematic diagram illustrating the essential components of a semiconductor transistor device and the employment of front-side and/or backside irradiation in the processing of the device according to a second aspect of the fourth embodiment of the process according to the present invention, wherein the device includes only drain and source regions without extension regions.

With reference now to FIGS. 5A and 5B, two aspects of a fourth embodiment of the process of the present inventions now described. The present (fourth) embodiment includes the first and second aspects having the same steps of the first and second aspects of the second embodiment respectively, discussed above, except that the amorphizing implants 40 and 70 are not performed. Accordingly, instead of doped amorphous drain and source regions 80 and 84 and doped amorphous extensions 60 and 62 (FIG. 3B), or just doped amorphous drain and source regions 80 and 84 (see FIG. 3C), there are formed doped extensions 60' and 62' and/or doped regions 80' and 84' that are essentially crystalline. Accordingly, the interfaces between drain region 80' (or source region 84') and the substrate are dopant-substrate interfaces I1' and I2', in analogy to amorphous-crystalline interfaces I1 and I2, as discussed in the third embodiment of the present invention.

Accordingly, with reference now first to FIG. 5A, in the first aspect of the present embodiment, after performing the steps associated with FIGS. 1A–1C, and forming deep dopant region 120 as described above in connection with FIG. 3A, the next step includes performing front-side irradiation with radiation beam 110, as described above in connection with the first aspect of the second embodiment.

An alternative to performing front-side irradiation is performing backside irradiation with radiation beam 116, as described above in connection with the second embodiment.

Another alternative to separately performing front-side and backside irradiation is performing both front side and backside irradiation using radiation beams 110 and 116, respectively, as described above in connection with the second embodiment.

With reference now to FIG. 5B, in a second aspect of the present (fourth) embodiment, the process follows the steps associated with FIGS. 1A–1C and the step of forming deep dopant region 120 as described above in connection with FIG. 3A. However, rather than forming extensions 60 and 62, dopant implant 50 is carried out to directly form drain and source regions 80' and 84' that extend down to about 50 nanometers, and that extent within substrate 10 to sides 38a and 38b, as extended into the substrate as indicated by the dashed lines. In this aspect of the present embodiment, with reference to FIG. 5B, irradiation to activate drain and source regions 80' and 84' is carried out as described above in connection with the various alternatives as set forth in the first aspect of the present embodiment.

The process of the present invention as described above with respect to the first embodiment results in activate drain and source regions 80' and 84' (and also extensions 60' and 62' in the first aspect of the embodiment), wherein the dopant profile is very shallow (on the order of 50 nm), has a sharply defined boundary, and has a very low sheet resistance, as indicated by the curves in FIG. 2.

The dopant concentration in the laser annealed regions (and extensions) that results is also much higher (e.g., on the order of $10^{21}$ cm$^{-3}$) and relatively scales with implant doses, while in comparison, for regions annealed using conventional RTA, the dopant concentration saturates at about $3 \times 10^{20}$ cm$^{-3}$. For a boron implant dose of $1 \times 10^{16}$ cm$^{-2}$, the sheet resistance obtained using the present process is about 73 Ω/sq (see FIG. 2). It is believed this represents the lowest sheet resistance reported for drain and source regions having a depth of 50 nanometers or shallower. It also indicates that the activated dopant concentration is above $10^{21}$ cm$^{-3}$, which is higher than the solid solubility limit.

While the present invention has been described in connection with preferred embodiments, it will be understood that it is not so limited. In addition, it will be understood that the particular radiation beam irradiance values and other parameters associated with practicing the present invention may best be determined empirically rather than analytically, as is common in the art of semiconductor processing. Accordingly, the present invention is intended to cover all alternatives, modifications and equivalents as may be included within the spirit and scope of the invention as defined in the appended claims.

What is claimed is:

1. A process for fabricating a transistor device on a semiconductor substrate having an upper surface, spaced apart shallow trench isolations, and a gate structure having first and second opposite sides formed on the upper surface between, and spaced apart from, the shallow trench isolations, said process comprising the steps of:

a) forming first amorphous regions of a first depth in the semiconductor substrate near the upper surface adjacent each of said first and second sides of the gate structure;

b) doping said first amorphous regions;

c) forming first and second sidewall spacers of a desired width adjacent each of said first and second sides of said gate structure, respectively, and above a portion of each of said first amorphous regions closest to said sides of said gate to define first and second doped amorphous extensions beneath said first and second sidewall spacers, respectively;

d) forming second amorphous regions in the semiconductor substrate adjacent each of said first and second sidewall spacers, opposite the substrate upper surface and co-located with portions of said first amorphous regions extending outward from beneath said first and second sidewall spacers with said second amorphous regions of a second depth that is at least as deep as said first depth;

e) doping said second amorphous regions and co-located portions of said first amorphous regions, thereby forming corresponding doped amorphous deep drain and doped amorphous deep source regions;

f) forming a strippable conformal layer atop the upper surface of the substrate, the sidewall spacers and the gate structure; and g) performing at least one of front-side irradiation and backside irradiation on said substrate, thereby providing sufficient heat to said first and second extensions and said deep drain and deep source regions to effectuate activation of said first and second extensions and said deep drain and deep source regions.

2. A process according to claim 1, wherein said heat in said step g) is insufficient to melt said first and second extensions, said deep drain and deep source regions.

3. A process according to claim 1, wherein said heat in said step g) is sufficient to melt said first and second extensions, said deep drain and deep source regions and insufficient to melt the substrate and gate structure.

4. A process according to claim 1, wherein said conformal layer is transparent to said front-side irradiation.

5. A process according to claim 1, wherein said conformal layer absorbs said front-side irradiation.

6. A process according to claim 1, wherein said conformal layer comprises at least one of tantalum nitride, titanium, titanium nitride, tantalum, tungsten nitride, oxide, and nitride.

7. A process according to claim 1, further including the step, after said step g), of stripping said conformal layer.

8. A process according to claim 1, wherein, said front-side irradiation is pulsed laser light having a wavelength of between 0.1 and 0.6 microns, a temporal pulse width of less than 1 ms, and at irradiance between 0.1 and 1000 J/cm$^2$ per pulse, and wherein said conformal layer is transparent to said wavelength.

9. A process according to claim 1, wherein said front-side irradiation is pulsed laser light having a wavelength of between 0.1 and 20 microns, a temporal pulse width of less than 1 ms, and an irradiance between 0.1 and 1000 J/cm$^2$ per pulse, and wherein said conformal layer absorbs said wavelength.

10. A process according to claim 1, wherein said backside irradiation is laser light having a wavelength between 1 to 20 microns, a temporal pulse length of less than 1 ms, and an irradiance between 0.1 and 1000 J/cm$^2$.

11. A process according to claim 1, wherein:

i) said step d) includes performing a boron dopant implant with a dose of $1 \times 10^{16}$ cm$^{-2}$ to a depth of 50 nanometers or less; and ii) said step f) is performed until said deep drain and deep source regions each have a sheet resistance of 200 Ω/sq or less.

12. A process for fabricating a transistor device on a semiconductor substrate having an upper surface, spaced apart shallow trench isolations, and a gate structure having first and second opposite sides formed on the upper surface between, and spaced apart from, the shallow trench isolations, said process comprising the steps of:

a) forming a deep dopant region within said substrate and spaced apart from the upper surface of the substrate;

b) forming first and second amorphous regions in the substrate adjacent the first and second sides of the gate structure as well as the upper surface of the substrate, and spaced apart from, and above said deep dopant region, said first and second amorphous regions respectively including first and second amorphous-crystalline interfaces within said substrate;

c) doping said first and second amorphous regions, thereby forming a corresponding doped deep drain region and a doped deep source region;

d) forming a strippable conformal layer atop the upper surface of the substrate and the gate structure; and e) performing at least one of front-side irradiation and backside irradiation, thereby providing sufficient heat to said deep dopant region to effectuate activation of said doped deep drain and source regions.

13. A process according to claim 12, wherein said heat in said step e) is insufficient to melt said deep drain and deep source regions.

14. A process according to claim 12, wherein said heat in said step e) is sufficient to melt said deep drain and source regions and insufficient to melt the substrate and gate structure.

15. A process according to claim 12, wherein said heat in said step e) is sufficient to activate said deep source and deep drain regions through explosive recrystallization.

16. A process according to claim 12, wherein said conformal layer is a transparent.

17. A process according to claim 12, wherein, said conformal layer is absorbing.

18. A process according to claim 12, wherein said conformal layer comprises at least one of tantalum nitride, titanium, titanium nitride, tantalum, tungsten nitride, oxide, and nitride.

19. A process according to claim 12, further including the step, after said step e), of stripping said conformal layer.

20. A process according to claim 12, wherein, said front-side irradiation is pulsed laser light having a wavelength of between 0.1 and 20 microns, a temporal pulse width of less than 1 ms, and an irradiance between 0.1 to 1000 J/cm$^2$ per pulse, and wherein said conformal layer is transparent to said wavelength.

21. A process according to claim 12, wherein said front-side irradiation is pulsed laser light having a wavelength of between 0.1 and 20 microns, a temporal pulse width of less than 1 ms, and an irradiance between 0.1 and 1000 J/cm$^2$ per pulse, and wherein said conformal layer absorbs said wavelength.

22. A process according to claim 12, wherein said backside irradiation is laser light having a wavelength between 1 and 20 microns, a temporal pulse length of less than 1 ms, and an irradiance between 0.1 and 1000 J/cm$^2$.

23. A process according to claim 12, wherein:

i) said step c) includes performing a boron dopant implant with a dose of $1 \times 10^{16}$ cm$^{-2}$ to a depth of 50 nm or less; and ii) said step e) is performed until said doped amorphous region has a sheet resistance of 200 Ω/sq or less.

24. A process for fabricating a transistor device on a semiconductor substrate having an upper surface, spaced apart shallow trench isolations, and a gate structure having first and second opposite sides formed on the upper surface between, and space apart from, the shallow trench isolations, said process comprising the steps of:

a) forming a deep dopant region within said substrate, and beneath and spaced apart from the upper surface of the substrate;

b) forming first amorphous regions of a first depth in the substrate adjacent the first and second sides of the gate structure as well as the upper surface of the substrate, and spaced apart from, and above said deep dopant region;

c) doping said first amorphous regions;

d) forming first and second sidewall spacers of a desired width adjacent each of said first and second sides of said gate structure, respectively, and above a portion of each of said first amorphous regions closest to said sides of said gate structure to define first and second doped amorphous extensions beneath said first and second sidewall spacers, respectively;

e) forming second amorphous regions in the semiconductor substrate adjacent each of said first and second sidewall spacers and the substrate upper surface, and co-located with portions of said first amorphous regions extending outward from beneath said first and second sidewall spacers with said second amorphous regions of a second depth that is at least as deep as said first depth;

f) doping said second amorphous regions and co-located portions of said first amorphous regions, thereby forming corresponding doped amorphous deep drain and doped amorphous deep source regions respectively including first and second amorphous-crystalline interfaces within said substrate;

g) forming a strippable conformal layer atop the upper surface of the substrate, the sidewall spacers and the gate structure; and h) performing at least one of front-side irradiation and backside irradiation on said substrate, thereby providing sufficient heat to said deep dopant region to effectuate activation of said first and second extensions and said deep drain and deep source regions.

25. A process according to claim 24, wherein said heat in said step h) is insufficient to melt said deep drain and deep source regions.

26. A process according to claim 24, wherein said heat in said step h) is sufficient to melt said deep drain and deep source regions and insufficient to melt the deep dopant region, the gate structure and the substrate.

27. A process according to claim 24, wherein said heat in said step h) is sufficient to activate said deep source and deep drain regions through explosive recrystallization.

28. A process according to claim 24, wherein said conformal layer is a transparent.

29. A process according to claim 24, wherein said conformal layer is absorbing.

30. A process according to claim 24, wherein said conformal layer comprises at least one of tantalum nitride, titanium, titanium nitride, tantalum, tungsten nitride, oxide, and nitride.

31. A process according to claim 24, further including the step, after said step h), of stripping said conformal layer.

32. A process according to claim 24, wherein, said front-side irradiation is pulsed laser light having a wavelength of between 0.1 and 20 microns, a temporal pulse width of less than 1 ms, and an irradiance between 0.1 to 1000 J/cm$^2$ per pulse, and wherein said conformal layer is transparent to said wavelength.

33. A process according to claim 24, wherein said backside irradiation is laser light having a wavelength between 1 and 20 microns, a temporal pulse length of less than 1 ms, and an irradiance between 0.1 and 1000 J/cm$^2$.

34. A process according to claim 24, wherein:

i) said step e) includes performing a boron dopant implant with a dose of $1\times10^{16}$ cm$^{-2}$ to a depth of 50 nm or less; and ii) said step g) is performed until said doped amorphous region has a sheet resistance of 200 Ω/sq or less.

35. A process for fabricating a transistor device on a semiconductor substrate having an upper surface, spaced apart shallow trench isolations, and a gate structure having first and second opposite sides formed on the upper surface between, and spaced apart from, the shallow trench isolations, said process comprising the steps of:

a) forming first doped regions of a first depth in the semiconductor substrate near the upper surface on each of said first and second sides of the gate;

b) forming first and second sidewall spacers of a desired width adjacent each of said first and second sides of said gate structure, respectively, and above a portion of each of said first doped regions closest to said sides of said gate structure to define first and second doped extensions beneath said first and second sidewall spacers, respectively;

c) forming second doped regions in the semiconductor substrate adjacent said first and second sidewall spacers, respectively, opposite the substrate upper surface and co-located with portions of said first doped regions extending outward from beneath said first and second sidewall spacers with said second doped regions of a second depth that is at least as deep as said first depth, said second doped regions and co-located portions of said first doped regions forming corresponding doped deep drain and source regions;

d) forming a strippable conformal layer atop the upper surface of the substrate, the sidewall spacers and the gate structure; and e) performing at least one of front-side irradiation and backside irradiation on said substrate, thereby providing sufficient heat to said first and second extensions and said deep drain and deep source regions to effectuate activation of said first and second extensions and said deep drain and deep source regions.

36. A process according to claim 35, wherein said heat in said step e) is insufficient to melt said first and second extensions, and said deep drain and deep source regions.

37. A process according to claim 35, wherein said heat in said step e) is sufficient to melt said first and second extensions, and said deep drain and deep source and insufficient to melt the substrate and gate structure.

38. A process according to claim 35, wherein said conformal layer is transparent to said front-side irradiation.

39. A process according to claim 35, wherein said conformal layer absorbs said front-side irradiation.

40. A process according to claim 35, wherein said conformal layer comprises at least one of tantalum nitride, titanium, titanium nitride, tantalum, tungsten nitride, oxide, and nitride.

41. A process according to claim 35, further including the step, after said step e), of stripping said conformal layer.

42. A process according to claim 35, wherein, said front-side irradiation is pulsed laser light having a wavelength of between 0.1 and 0.6 microns, a temporal pulse width of less than 1 ms, and an irradiance between 0.1 and 1000 J/cm$^2$ per pulse, and wherein said conformal layer is transparent to said wavelength.

43. A process according to claim 35, wherein said front-side irradiation is pulsed laser light having a wavelength of between 0.1 and 20 microns, a temporal pulse width of less than 1 ms, and an irradiance between 0.1 and 1000 J/cm$^2$ per pulse, and wherein said conformal layer absorbs said wavelength.

44. A process according to claim 35, wherein said backside irradiation is laser light having a wavelength between 1 to 20 microns, a temporal pulse length of less than 1 ms, and an irradiance between 0.1 and 1000 J/cm$^2$.

45. A process according to claim 35, wherein:
   i) said step b) includes performing a boron dopant implant with a dose of 1×10$^{16}$ cm$^{-2}$ to a depth of 50 nanometers or less; and
   ii) said step d) is performed until said deep drain and said deep source have a sheet resistance of 200 Ω/sq or less.

46. A process for fabricating a transistor device on a semiconductor substrate having an upper surface, spaced apart shallow trench isolations, and a gate structure having first and second opposite sides formed on the upper surface between, and spaced apart from, the shallow trench isolations, said process comprising the steps of:
   a) forming first and second doped regions in the semiconductor substrate near the upper surface extending outward from each of said first and second sides of the gate;
   b) forming first and second sidewall spacers of a desired width adjacent each of said first and second sides of said gate, respectively, and above a portion of each of said first and second doped regions closest to said side of said gate to define first and second doped extensions beneath said first and second sidewall spacers, respectively, the portions of said first and second doped regions extending outward from beneath said first and second sidewall spacers forming corresponding doped deep drain and source regions;
   c) forming a strippable conformal layer atop the upper surface of the substrate, the sidewall spacers and the gate structure; and
   d) performing at least one of front-side irradiation and backside irradiation on said substrate, thereby providing sufficient heat to said deep drain and deep source regions to effectuate activation of the deep drain and deep source regions.

47. A process according to claim 46, wherein said heat in said step d) is sufficient to melt said first and second extensions, and said deep drain and deep source regions.

48. A process according to claim 46, wherein said heat in said step d) is sufficient to melt said first and second extensions, and said deep drain and deep source regions and insufficient to melt the substrate and gate structure.

49. A process according to claim 46, wherein said conformal layer is transparent to said front-side irradiation.

50. A process according to claim 46, wherein said conformal layer absorbs said front-side irradiation.

51. A process according to claim 46, wherein said conformal layer comprises at least one of tantalum nitride, titanium, titanium nitride, tantalum, tungsten nitride, oxide, and nitride.

52. A process according to claim 46, further including the step, after said step d), of stripping said conformal layer.

53. A process according to claim 46 wherein, said front-side irradiation is pulsed laser light having a wavelength of between 0.1 and 0.6 microns, a temporal pulse width of less than 1 ms, and an irradiance between 0.1 and 1000 J/cm$^2$ per pulse, and wherein said conformal layer is transparent to said wavelength.

54. A process according to claim 46, wherein said front-side irradiation is pulsed laser light having a wavelength of between 0.1 and 20 microns, a temporal pulse width of less than 1 ms, and an irradiance between 0.1 and 1000 J/cm$^2$ per pulse, and wherein said conformal layer absorbs said wavelength.

55. A process according to claim 46, wherein said backside irradiation is laser light having a wavelength between 1 to 20 microns, a temporal pulse length of less than 1 ms, and an irradiance between 0.1 and 1000 J/cm$^2$.

56. A process according to claim 46, wherein:
   i) said step a) includes performing a boron dopant implant with a dose of 1×10$^{16}$ cm$^{-2}$ to a depth of 50 nanometers or less; and
   ii) said step d) is performed until said deep drain and said deep source have a sheet resistance of 200 Ω/sq or less.

57. A process for fabricating a transistor device on a semiconductor substrate having an upper surface, spaced apart shallow trench isolations, and a gate structure having first and second opposite sides formed on the upper surface between, and spaced apart from, the shallow trench isolations, said process comprising the steps of:
   a) forming a deep dopant region within said substrate and spaced apart from the upper surface of the substrate;
   b) forming first doped regions of a first depth in the first and second sides of the gate structure as well as the upper surface of the substrate, and spaced apart from, and above, said deep dopant region;
   c) forming first and second sidewall spacers of a desired width adjacent each of said first and second sides of said gate structure, respectively, and above a portion of each of said first doped regions closest to said sides of said gate structure to define first and second doped extensions beneath said first and second sidewall spacers, respectively;
   d) forming second doped regions in the substrate adjacent each of said first and second sidewall spacers and the substrate upper surface, and co-located with portions of said first doped regions extending outward from beneath said first and second sidewall spacers with said second doped regions having a bottom at a second depth that is at least as deep as said first depth and above said deep dopant region, said second doped regions being deep drain and deep source regions, respectively, having drain substrate and source-substrate interfaces, respectively;
   e) forming a strippable conformal layer atop the upper surface of the substrate, the sidewall spacers and the gate structure; and
   f) performing at least one of front-side irradiation and backside irradiation on said substrate, thereby providing sufficient heat to said deep dopant region to effectuate activation of said first and second extensions and said drain and source regions.

58. A process according to claim 57, wherein said heat in said step f) is insufficient to melt said first and second extensions and said deep drain and deep source regions.

59. A process according to claim 57, wherein said heat in said step f) is sufficient to melt said first and second extensions and said deep drain and deep source regions and insufficient to melt the substrate and gate structure.

60. A process according to claim 57, wherein said heat in said step f) is sufficient to activate said first and second extensions and said deep source and deep drain regions through explosive recrystallization.

61. A process to claim 57, wherein said conformal layer is a transparent.

62. A process according to claim 57, wherein said conformal layer is absorbing.

63. A process according to claim 57, wherein said conformal layer comprises at least one of tantalum nitride, titanium, titanium nitride, tantalum, tungsten nitride, oxide, and nitride.

64. A process according to claim 57, further including the step, after said step f), of stripping said conformal layer.

65. A process according to claim 57, wherein, said front-side irradiation is pulsed laser light having a wavelength of between 0.6 and 20 microns, a temporal pulse width of less than 1 ms, and an irradiance between 0.1 to 1000 J/cm$^2$ per pulse, and wherein said conformal layer is transparent to said wavelength.

66. A process according to claim 57, wherein said front-side irradiation is pulsed laser light having a wavelength of between 0.1 and 20 microns, a temporal pulse width of less than 1 ms, and an irradiance between 0.1 and 1000 J/cm$^2$ per pulse, and wherein said conformal layer absorbs said wavelength.

67. A process according to claim 57, wherein said back-side irradiation is laser light having a wavelength between 1 and 20 microns, a temporal pulse length of less than 1 ms, and an irradiance between 0.1 and 1000 J/cm$^2$.

68. A process according to claim 57, wherein:
 i) said step c) includes performing a boron dopant implant with a dose of $1\times10^{16}$ cm$^{-2}$ to a depth of 50 nm or less; and
 ii) said step e) is performed until said doped amorphous region has a sheet resistance of 200 Ω/sq or less.

69. A process for fabricating a transistor device on a semiconductor substrate having an upper surface, spaced apart shallow trench isolations, and a gate structure having first and second opposite sides formed on the upper surface between, and spaded apart from, the shallow trench isolations, said process comprising the steps of:
 a) forming a deep dopant region within said substrate and spaced apart from the upper surface of the substrate;
 b) forming doped deep drain and deep source regions in the substrate adjacent the first and second sides of the gate structure and the upper surface, and spaced apart from said deep dopant region, thereby forming a first interface between the deep drain region and the substrate and a second interface between the deep source region and the substrate;
 c) forming a strippable conformal layer atop the upper surface of the substrate and the gate structure; and
 d) performing at least one of front-side irradiation and backside irradiation, thereby providing sufficient heat to said deep dopant region to effectuate activation of said deep drain and deep source regions.

70. A process according to claim 69, wherein said heat in said step d) is insufficient to melt said deep drain and deep source regions.

71. A process according to claim 69, wherein said heat in said step d) is sufficient to melt said deep drain and deep source regions and insufficient to melt the substrate and gate structure.

72. A process according to claim 69, wherein said heat in said step d) is sufficient to activate said deep source and deep drain regions through explosive recrystallization.

73. A process according to claim 69, wherein said conformal layer is a transparent.

74. A process according to claim 69, wherein said conformal layer is absorbing.

75. A process according to claim 69, wherein said conformal layer comprises at least one of tantalum nitride, titanium, titanium nitride, tantalum, tungsten nitride, oxide, and nitride.

76. A process according to claim 69, further including the step, after said step e), of stripping said conformal layer.

77. A process according to claim 69, wherein, said front-side irradiation is pulsed laser light having a wavelength of between 0.6 and 20 microns, a temporal pulse width of less than 1 ms, and an irradiance between 0.1 to 1000 J/cm$^2$ per pulse, and wherein said conformal layer is transparent to said wavelength.

78. A process according to claim 69, wherein said front-side irradiation is pulsed laser light having a wavelength of between 0.1 and 20 microns, a temporal pulse width of less than 1 ms, and an irradiance between 0.1 and 1000 J/cm$^2$. pulse, and wherein said conformal layer absorbs said wavelength.

79. A process according to claim 69, wherein said back-side irradiation is laser light having a wavelength between 1 and 20 microns, a temporal pulse length of less than 1 ms, and an irradiance between 0.1 and 1000 J/cm$^2$.

80. A process according to claim 69, wherein:
 i) said step b) includes performing a boron dopant implant with a dose of $1\times10^{16}$ cm$^{-2}$ to a depth of 50 nm or less; and
 ii) said step d) is performed until said doped amorphous region has a sheet resistance of 200 Ω/sq or less.

* * * * *